United States Patent [19]
Honda

[11] 3,944,962
[45] Mar. 16, 1976

[54] VARIABLE RESISTANCE ATTENUATOR

[75] Inventor: Hisashi Honda, Tokyo, Japan

[73] Assignee: Nippon Electric Company, Limited, Tokyo, Japan

[22] Filed: Aug. 22, 1974

[21] Appl. No.: 499,653

[30] Foreign Application Priority Data
Aug. 22, 1973 Japan.............................. 48-94743

[52] U.S. Cl................... 338/126; 323/96; 333/81 R; 338/127; 338/142
[51] Int. Cl.² H03H 7/26; H01C 13/02; H01C 10/16; H01C 10/22
[58] Field of Search ......... 338/48, 92, 97, 122, 123, 338/125, 126, 127, 137, 138, 139, 142, 217; 323/94 R, 96; 333/81 R, 81 A

[56] References Cited
UNITED STATES PATENTS
3,693,062  9/1972  Von Vick .............................. 338/92
3,846,731  11/1974  Dumas et al........................ 338/127

OTHER PUBLICATIONS
German Utility Model (Gebrauchsmuster), No. 1,957,345, Mar. 23, 1967.

*Primary Examiner*—Laramie E. Askin
*Attorney, Agent, or Firm*—Ostrolenk, Faber, Gerb & Soffen

[57] ABSTRACT

A variable-resistance attenuator having first and second resistive layers deposited upon an insulating substrate. Input and output terminals are electrically connected at spaced intervals to one of the resistive layers and a common terminal is electrically connected to the remaining one of the resistive layers. A pair of contacts are adapted to make slidable electrical engagement, each with an associated one of the resistive layers. Conductive bridging means mechanically and electrically connect the sliding contacts. Mechanical means are provided for simultaneous movement of the sliding contacts to change the resistance in a smooth and continuous fashion.

11 Claims, 12 Drawing Figures

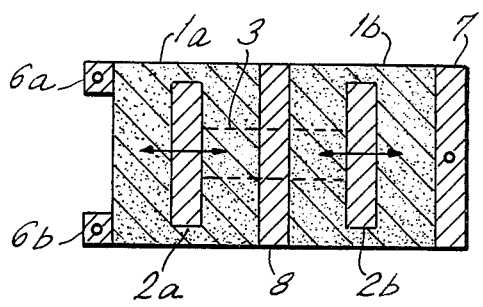
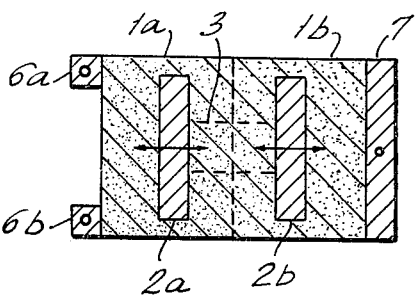
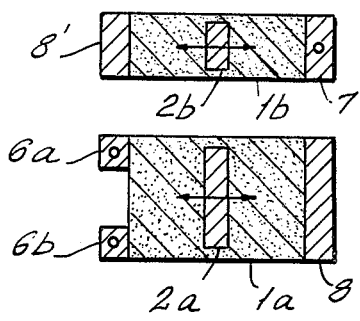
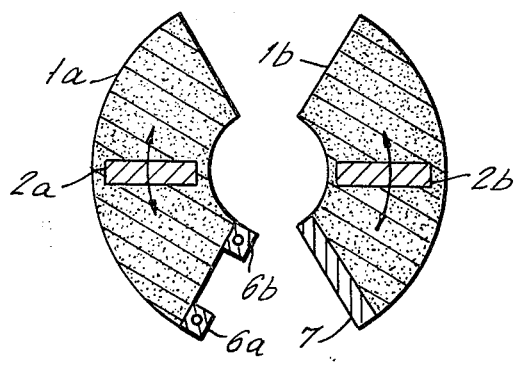
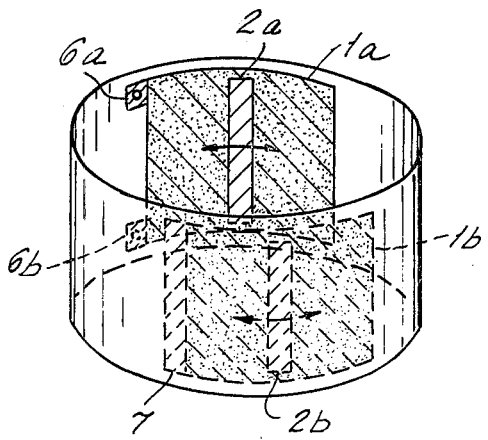

VARIABLE RESISTANCE ATTENUATOR

This invention relates to variable-resistance attenuators and, more particularly, to variable-resistance attenuators suited for use in high-frequency circuits.

Conventional variable-resistance attenuators can be classified into two types: Bridged T type variable-resistance attenuators comprising a plurality of variable resistors and step-type variable attenuators, the attenuation of which can be varied in steps by switching fixed resistors having different resistance values with input and output switches. In spite of an outstanding feature for enabling the attenuation to be varied continuously, the bridged T type variable-resistance attenuator has drawbacks such as poor frequency characteristics, operating frequencies that can barely extend to the VHF band, a complicated circuit arrangement, and expensive manufacturing cost. In contrast, the operating frequencies of the step-type variable-resistance attenuator can cover the UHF frequency band, but it is disadvantageous in that its size tends to become bulky due to the incorporation of switching means and that the attenuation can only be varied in steps.

It is a major object of this invention to provide an improved variable-resistance attenuator of extreme structural compactness and low manufacturing cost which can vary the attenuation continuously and find high-frequency application. The variable-resistance attenuator of the invention generally comprises a pair of mechanically and electrically connected slidable contacts so disposed on the surfaces of the resistive layers as to be slidable freely, a pair of input and output terminals provided at one end of one of the resistive layers along the sliding direction of these slidable contacts, and a common terminal provided at one end of the other of the resistive layers.

Now, this invention will be described more in detail in conjunction with the accompanying drawings in which;

FIGS. 8 to 11 show the partial plan views of other embodiments of this invention; and FIG. 12 shows a perspective view of still another embodiment of this invention.

Figure 1:
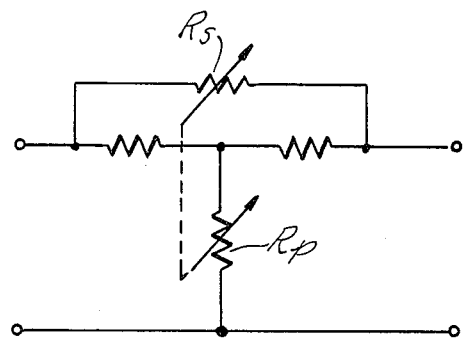
FIG. 1 is a schematic diagram of a conventional bridged T type variable-resistance attenuator.
Figure 2:
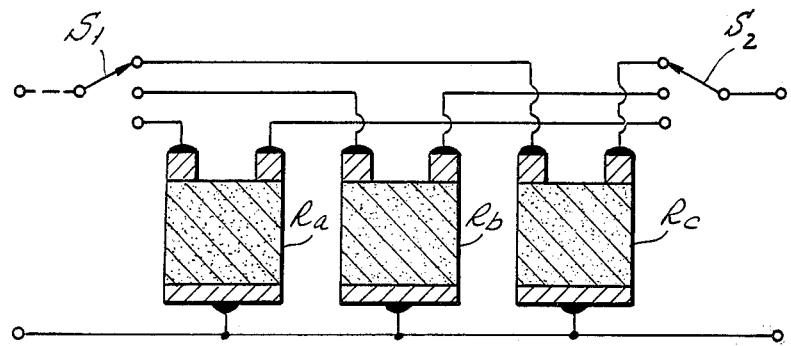
FIG. 2 is a schematic diagram of a conventional step-type variable-resistance attenuator.

Referring now to FIGS. 1 and 2, conventional variable-resistance attenuators will be explained. FIG. 1 shows a bridged T type variable-resistance attenuator which comprises a couple of variable resistors Rs and Rp and a couple of fixed resistors. Since four independent resistors and connecting wires to connect these four resistors as shown in FIG. 1 are thus included, a lot of parasitic inductances and capacitances are inevitably present in this prior art attenuator. This T type attenuator has the drawbacks, therefore, of poor frequency characteristics and low operating frequencies that can barely extend to the VHF band. Moreover, complicated circuit arrangement and expensive manufacturing cost are other disadvantages of this prior art attenuator. FIG. 2 shows a step-type variable-resistance attenuator which comprises fixed resistors $Ra$, $Rb$ and $Rc$ having different resistance values and input and output switches $S_1$ and $S_2$. The amount of attenuation of this attenuator can be varied in three steps by selecting one of the fixed resistors $Ra$, $Rb$ and $Rc$ with the switches $S_1$ and $S_2$. This step-type attenuator has drawbacks, as stated above, such that its size tends be become bulky due to the incorporation of switching means and that the continuous attenuation is impossible.

Figure 3:
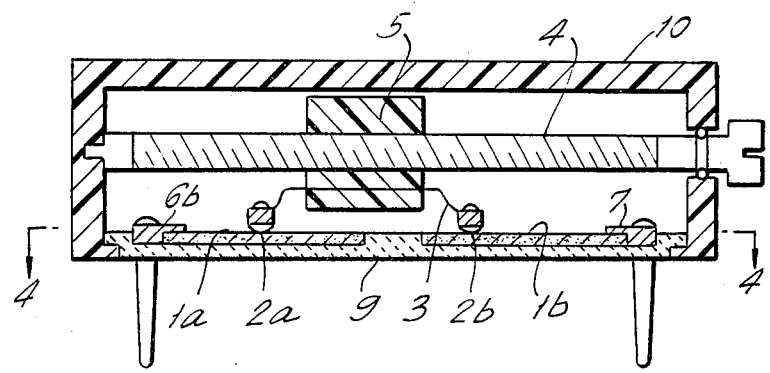
FIG. 3 is a sectional elevation of a variable-resistance attenuator according to an embodiment of this invention.
Figure 4:
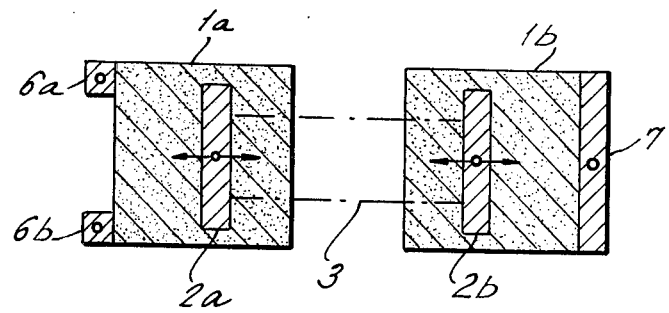
FIG. 4 is a partially cross-sectional view taken along the line 4-4 and looking in the direction of arrows of FIG. 3.

Referring to FIGS. 3 and 4, a first embodiment of this invention comprises two thin layers $1a$ and $1b$ of a resistive material on which slidable contacts $2a$ and $2b$ connected electrically and mechanically with each other by a shorting bar 3 are respectively mounted. In this embodiment, the thin layers $1a$ and $1b$ are formed of tantalum nitride which is deposited on a ceramic substrate 9 by sputtering, and arranged in a line in the sliding direction of the slidable contacts $2a$ and $2b$. Each of these resistive layers is of a square shape having the length of each side of 5mm. The slidable contacts may be of a point-shape, but if it is desired that amounts of variable attenuation include zero, the contact $2a$ that is provided on the resistive layer having input and output terminals $6a$ and $6b$, to be mentioned below, should have a width sufficient to be capable to contacting with both the input and output terminals $6a$ and $6b$. In this embodiment, both the contacts $2a$ and $2b$ have a width of 4mm, the contact $2a$ being adapted to contact with the input and output terminals $6a$ and $6b$. The contacts $6a$ and $6b$ and shorting bar 3 are formed of brass in this embodiment. The shorting bar 3 is attached to an internally threaded movable member 5 made of nylon resin carried on a feed screw 4 made of brass so that it may be displaced in the left or right direction and, hence, the slidable contacts $2a$ and $2b$ may slide along the surfaces of the resistive layers $1a$ and $1b$ respectively by rotary motion of the feed screw 4. The feed screw 4 is carried by a covering 10 made of nylon resin which covers the resistive layers $1a$ and $1b$ and is in turn rigidly fixed to the substrate 9. The input and output terminals $6a$ and $6b$ are formed by evaporation of nichrome and gold in 1mm squares at one end of one resistive layer such as $1a$ in the sliding direction along which the slidable contacts move. A grounding terminal 7 is formed by evaporation of nichrome and gold at the opposite end of the other resistive layer $1b$ in the sliding direction, as illustrated in FIG. 4. An ohmic contact for the grounding terminal 7 should preferably be formed over the entire length of such side of the resistive layer $1b$ that is perpendicular to the sliding direction of the slidable contacts. A stopper (not shown) is provided to abut against the movable element 5 to prevent the engagement of the slidable contact $2b$ with the grounding terminal 7. An input signal is applied across the input terminal $6a$ and the common or grounding terminal 7 and an output signal is taken out across the output terminal $6b$ and the grounding terminal 7 between which a load element (not shown) is connected.

Where the movable contacts 2a and 2b are moved toward the input and output terminals 6a and 6b, the amount of attenuation introduced between the input and output signals, or between the input terminal 6a and the output terminal 6b, decreases. On the contrary, where the slidable contacts 2a and 2b are moved toward the grounding terminal 7, the amount of attenuation increases. In other words, the amount of attenuation of this variable attenuator can be continuously varied from zero to a maximum value which is determined by resistance values of the resistive layers between the slidable contacts and terminals where the slidable contact 2a is at the farthest location from the input and output terminals, by moving the slidable contacts 2a and 2b from the position where the contact 2a is in contact with both the input and output terminals 6a and 6b to the position where the contact 2a is at the mentioned farthest location.

The variable-resistance attenuator according to this invention thus has a very simple and compact structure and hence its manufacturing cost can be very low. In particular, parasitic inductances and capacitances are lowered quite substantially by this invention, because the attenuator of this invention is comprised of only two sheets of resistive layers and, as internal wiring connection, only a single member (the shorting bar 3) is needed. This means that the attenuator of this invention has good frequency characteristics and high operating frequencies.

Figure 5:
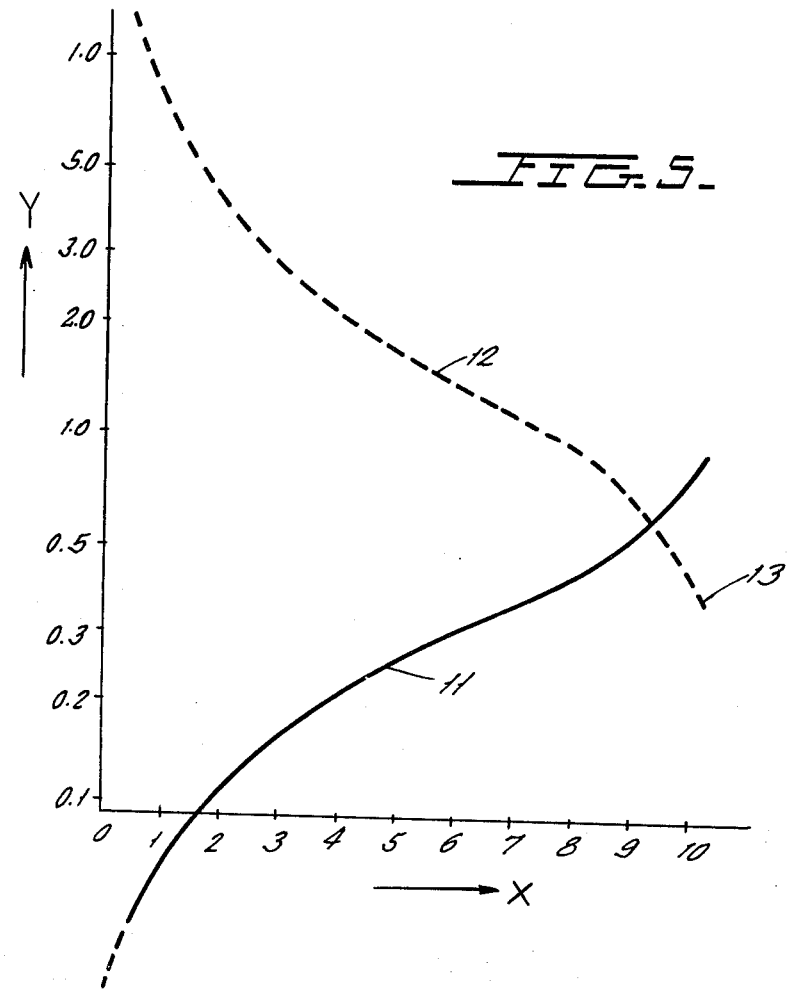
FIG. 5 shows characteristic curves for the resistance values of the resistive layers used in the embodiment of this invention.

According to another aspect of this invention, the manner of variation of attenuation with the displacement of the slidable contacts can be controlled by varying the resistivity of the resistive layers along the sliding direction of the slidable contacts. Of course, the resistivity of the resistive layers 1a and 1b may be not varied, that is, it remains constant along the sliding direction of the slidable contacts 2a and 2b. In such case, the amount of attenuation first increases with displacement of the slidable contact 2a from the input and output terminals 6a and 6b, but finally becomes saturated. Where it is desired for the amount of attenuation to be varied linearly with the displacement of the slidable contacts 2a and 2b, the resistivities of the resistive layers 1a and 1b should be varied along the sliding direction of the slidable contacts 2a and 2b in such a manner that the resistance $R_1$ between the slidable contact 2a and the input or output terminal 6a or 6b and the resistance $R_2$ between the slidable contact 2b and the common terminal 7 is changed respectively as shown by curves 11 and 12 of FIG. 5 which have been determined experimentally. In FIG. 5, the ordinate Y logarithmically denotes a value of the resistance $R_1$ or $R_2$ divided by the characteristic impedance (50 ohms in case of this embodiment) of the attenuator. The abscissa X represents the location of the slidable contacts 2a and 2b on the resistive layers 1a and 1b from the position 0 where the contact 2a is in contact with the input and output terminals 6a and 6b and where $R_1$ is zero (not shown by the curve 11) and $R_2$ is very large to the position 10 where the contact 2b is as near the common terminal 7 as possible and where $R_2$ has a value indicated by the end 13 of the curve 12. The scale on the abscissa denotes the distance from the position 0 and to 10 divided in ten equal parts. In this embodiment, the thickness of each of the tantalum nitride resistive layers 1a and 1b is varied along the sliding direction in order to realize such changes in $R_1$ and $R_2$ as shown respectively in the curves 11 and 12. Alternatively, the widths of each of the resistive layers 1a and 1b may be varied along the sliding direction with their thickness being constant, for the same purpose.

It has been found that in the attenuator of this embodiment, its characteristic impedance is constant irrespective of the amount of attenuation and the amount of attenuation is not changed over a wide frequency range at any value of the amount of attenuation.

Figure 6:
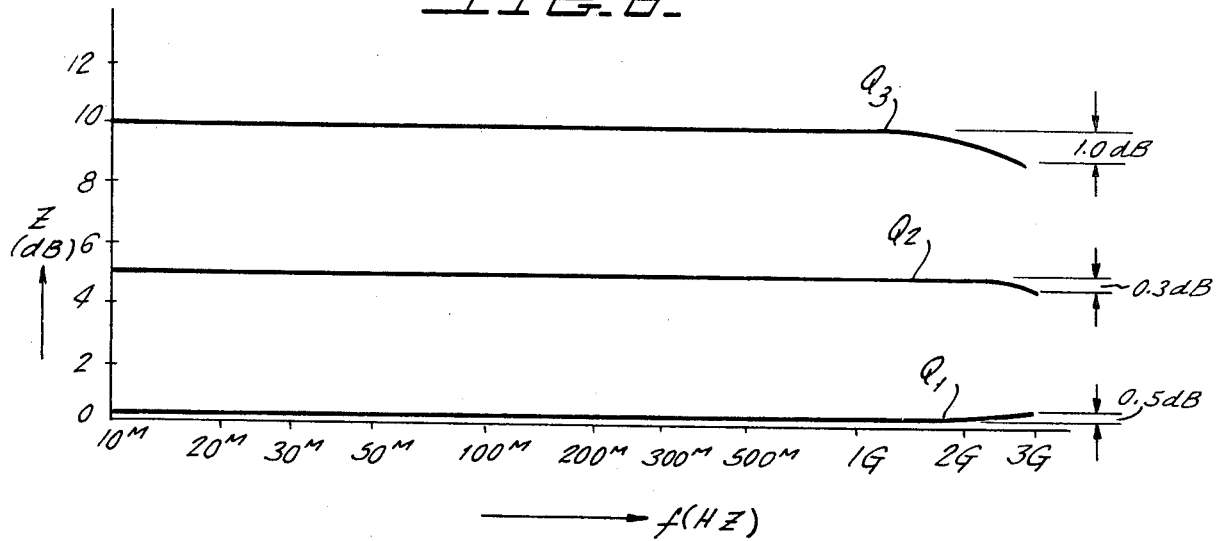
FIG. 6 shows attenuation vs. frequency characteristic curves measured for the embodiment of this invention.

FIG. 6 depicts the measured values for the attenuator of the embodiment, wherein the abscissa and the ordinate denote respectively the frequency (Hz) and the amount of attenuation (dB). The curve $Q_1$ is an attenuation vs. frequency characteristic in the case where the amount of attenuation for the direct current is 0.2dB. The curves $Q_2$ and $Q_3$ are attenuation vs. frequency characteristics in cases where the amounts of attenuation for the direct current are 5dB and 10dB respectively. Any one of these curves offers a substantially flat frequency response within a wide range of frequencies up to about 1 or 2GHz and can be practiced up to sufficiently high frequencies.

Figure 7:
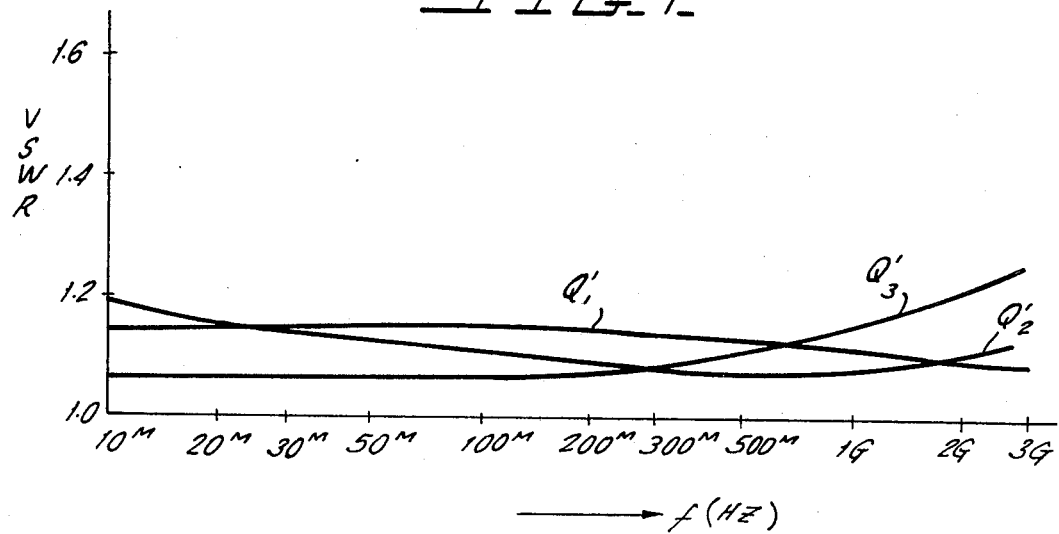
FIG. 7 shows curves illustrating the VSWR versus frequency relationship measured for the embodiment of this invention.

FIG. 7 shows that the voltage-standing-wave ratios (VSWR) can be maintained below 1.2 for frequencies up to 1GHz when the characteristic impedance is 50 ohms. It is to be noted here that the curves $Q'_1, Q'_2$, and $Q'_3$ correspond respectively to the amounts of attenuation of the curves $Q_1, Q_2$ and $Q_3$ shown in FIG. 6.

Some other embodiments of this invention are illustrated in FIGS. 8 to 12, in which the reference numerals 1a, 1b, 2a, 2b, 3, 6a, 6b and 7 denote the same or similar parts as those shown thereby in FIG. 4.

In the embodiment shown in FIG. 8, an electrode 8 for electrically coupling resistive layers 1a and 1b is disposed between these layers for convenience of measurment of the resistance of each of these layers.

In the embodiment shown in FIG. 9, the resistive layers 1a and 1b are unified into a single layer. Even in this case, the resistance values distribute as shown by the curves 11 and 12 in FIG. 5 with an intermediary portion of the resistive layers 1a and 1b layer as its boundary.

In the embodiment shown in FIG. 10, resistive layers 1a and 1b are disposed in parallel and slidable contacts 2a and 2b move so as to maintain a spaced parallel relationship. By this contrivance, the overall length of the attenuator can be appreciably contracted. In this embodiment, the width of the resistive layer 1b is made less than that of the resistive layer 1a for making its resistance value $R_b$ less than the resistance value $R_a$ of 1a. Moreover, additional terminals 8 and 8' are attached to the free ends of the resistive layers 1a and 1b, respectively. These terminals 8 and 8' may be used for measurement of the resistance values of the resistive layers 1a and 1b.

In the still other embodiment shown in FIG. 11, resistive layers 1a and 1b are formed in a fan-shape and 2a and contacts 2b are installed on a rotating shaft so that the attenuation may be varied by rotary motion of the shaft.

It is possible as shown in FIG. 12 to dispose resistive layers 1a and 1b on the inner surface of a cylindrical body and to make slidable contacts 2a and 2b slide along the cylindrical surface.

While the present invention has been described with reference to several preferred embodiments thereof, many variations and modifications will now become apparent to those skilled in the art. I do not wish, therefore, to be limited by the specifice disclosure herein, but only by the appended claims.

I claim:

1. A variable-resistance attenuator comprising a first resistive layer, a second resistive layer, first and second slidable contacts mechanically and electrically connected to one another and respectively disposed on the sufaces of said first and second resistive layers, input and output terminals provided at one end of said first resistive layer in the sliding direction of said first slidable contact, a common terminal provided at one end of said second resistive layer in the sliding direction of said second slidable contact, and means attached to said first and second slidable contacts for moving said first slidable contact in a first direction relative to said one end of said first resistive layer to vary the amount of electrical attenuation between said input and output terminals and for simultaneously moving said second slidable contact in an opposite direction relative to said one end of said second resistive layer to maintain the impedance between each of said input and output terminals and said common terminal at a constant value.

2. The variable-resistance attenuator according to claim 1, in which the resistance value of said first resistive layer between said input terminal and said first slidable contact is substantially equal to the resistance value between said output terminal and said first slidable contact.

3. The variable-resistance attenuator according to claim 1 wherein said common terminal is formed over the entire length of said one end of said second resistive layer in the direction substantially perpendicular to said sliding direction of said second slidable contact.

4. The variable-resistance attenuator according to cliam 1 wherein said first and second resistive layers are arranged in a line.

5. The variable-resistance attenuator according to claim 4, wherein said first and second resistive layers are unified into a single layer, said input and output terminals being provided at one end of said single layer and said common terminal being provided at the opposite end of said single layer.

6. The variable-resistance attenuator according to claim 4, further comprising a first electrode formed at the end of said first resistive layer opposite to said input and output terminals, a second electrode formed at the end of said second resistive layer opposite to said common terminal, and means electrically connecting said first and second electrodes to one another.

7. The variable-resistance attenuator according to claim 1, wherein said first and second resistive layers are arranged in parallel.

8. The variable-resistance attenuator according to claim 7, further comprising a first electrode provided at the other end of said first resistive layer in said sliding direction of said first slidable contact and a second electrode provided at the other end of said second resistive layer in said sliding direction of said second slidable contact.

9. The variable-resistance attenuator according to claim 1 wherein said first and second resistive layers are each formed in a fan-shape and arranged on a circle.

10. The variable-resistance attenuator according to claim 1 wherein said first and second resistive layers are formed on an inner surface of a cylindrical body.

11. The variable-resistance attenuator according to claim 1, wherein resistivities of said first and second resistive layers are so varied in said sliding direction of said first slidable contact and in said sliding direction of said second slidable contact, respectively, that the amount of attenuation of the attenuator is linearly varied with displacement of said slidable contacts.

* * * * *